United States Patent [19]

Aite et al.

[11] Patent Number: 5,225,375
[45] Date of Patent: Jul. 6, 1993

[54] PLASMA ENHANCED CHEMICAL VAPOR PROCESSING OF SEMICONDUCTOR SUBSTRATES

[75] Inventors: Kamel Aite, Fredericton; R. B. DesBrisay, Moncton; Lee Danisch, Fredericton, all of Canada

[73] Assignee: Process Technology (1988) Limited, Oromocto, Canada

[21] Appl. No.: 702,425

[22] Filed: May 20, 1991

[51] Int. Cl.⁵ .............. H01L 21/302; B05D 5/12; B05B 5/025; C23C 16/00
[52] U.S. Cl. .................. 437/225; 118/620; 118/715; 118/723; 427/124
[58] Field of Search ........... 118/723, 728, 729, 730, 118/733; 437/225

[56] References Cited

U.S. PATENT DOCUMENTS

| 4,751,895 | 6/1988 | Yates | 118/728 |
| 5,050,534 | 9/1991 | Yates | 118/733 |

FOREIGN PATENT DOCUMENTS

| 60-182130 | 9/1985 | Japan | 118/723 |
| 60-202929 | 10/1985 | Japan | 118/723 |
| 61-164224 | 7/1986 | Japan | 118/723 |
| 63-283016 | 11/1986 | Japan | 118/723 |
| 1-80023 | 3/1989 | Japan | 118/723 |
| 1-137621 | 5/1989 | Japan | 118/723 |
| 1-230782 | 9/1989 | Japan | 118/723 |
| 1-232717 | 9/1989 | Japan | 118/723 |
| 1-297818 | 11/1989 | Japan | 118/723 |
| 2-213482 | 8/1990 | Japan | 118/723 |

Primary Examiner—Olik Chaudhuri
Assistant Examiner—Ramamohan R. Paladugu
Attorney, Agent, or Firm—S. T. Jelly

[57] ABSTRACT

For plasma enhanced chemical vapor processing of semiconductor substrates, substrates are mounted on an elongate support, in a spaced parallel array. A shaft is rotatably mounted on the support and has electrode holding means, the electrodes alternating in polarity. The shaft, when rotated, moves the electrodes down in between the substrates, for positioning of the assembly in a reaction chamber for processing. After processing, and removal from the chamber, the shaft is rotated to move the electrodes out from between the substrates, to permit easy loading and unloading. The substrates are normally supported on boats positioned on the support. A particularly effective rf power feedthrough connects rf power from a power source through the door of the chamber.

16 Claims, 7 Drawing Sheets

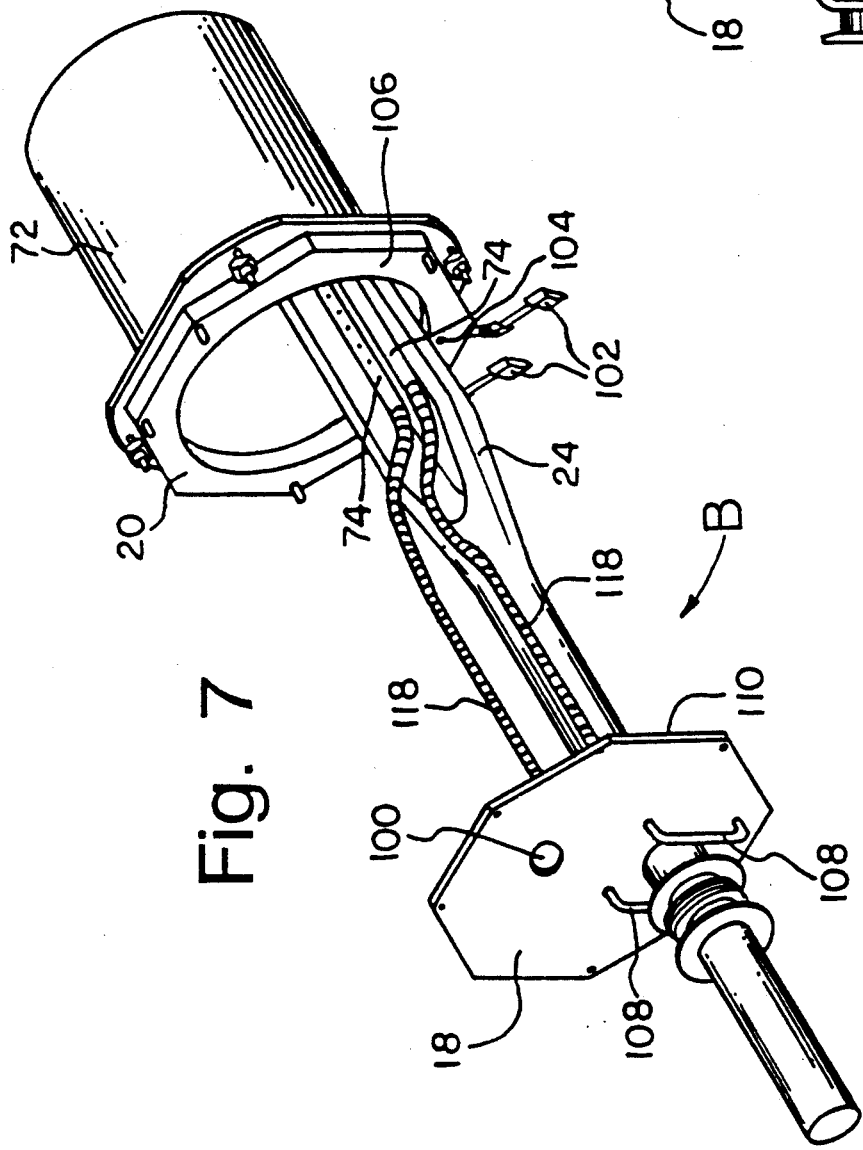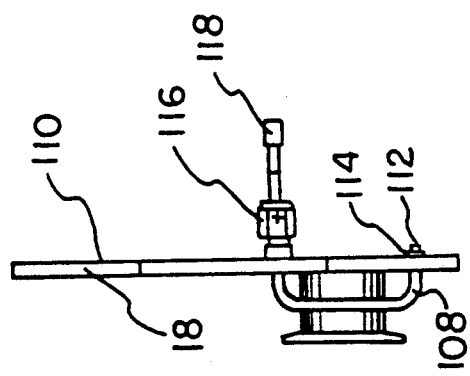

PLASMA ENHANCED CHEMICAL VAPOR PROCESSING OF SEMICONDUCTOR SUBSTRATES

This invention relates to plasma enhanced chemical vapour processing of semiconductor substrates. In particular the invention relates to an improved apparatus for such a process and an associated method.

Semiconductor substrates, usually referred to as wafers, are treated in an evacuated chamber, through which reactant gases are passed. The chamber is heated and also, to enhance the process, an rf plasma is developed in the chamber.

It has been proposed to position plasma electrodes, spaced apart, along the reaction chamber, with the electrodes extending transversely across the chamber. Wafers are positioned on either side of each electrode.

Typical examples of such an apparatus are described in U.S. Pat. Nos. 4,178,877; 4,292,153; 4,610,748; and 4,873,942. These all use the same principal of a horizontal tubular type vessel where the substrate materials are held on electrode plates having their surface perpendicular to the axis of the tube. In these systems the electrode plates are assembled on two electrode bars which carry the rf power. This assembly is produced with a welding technique or by using spacers between the electrode plates. Such structures are complex and the long term mechanical stability of the whole assembly is poor. Its maintenance is complex and time consuming. For example, it happens frequently, due to the thermal expansion of the spacers, that one or more electrodes break. Replacing one electrode having a position in the middle of the boat requires the removal of the whole assembly thus leading to considerable undesirable downtime. Another critical problem concerns the contaminating particulate generation which is increased by the manner in which the substrates are held in the reaction chamber.

Other forms of apparatus are known, in which the wafers are held parallel to the reaction chamber axis, for example U.S. Pat. Nos. 3,615,956, 3,837,856, and 4,223,048, with a resultant very reduced capacity. Other forms of apparatus have various disadvantages, such as lack of control and uniformity of the plasma.

In addition, in all existing systems the wafers must be loaded and unloaded one by one. In order to avoid the costly and time consuming process of loading the wafers manually into and subsequently out of, boats requires complex and expensive robotics which again contributes to the particulate generation. The wafers may also be scratched and contaminated during the loading and unloading operations because they are clamped on the rf electrodes. Furthermore, all the devices proposed until now have the major constraint of the inability to use any mass wafer transfer where a quantity of wafers can be easily transferred from a plastic cassette to a quartz carrier and vice versa. In other terms, the existing plasma chemical vapor deposition batch systems perform the wafer loading and unloading by transferring manually or automatically the wafers one by one from the cassette to each face of the rf electrode.

The present invention provides an improved apparatus for producing a plasma treatment of substrate materials, having a high throughput and high quality. The invention provides a multi-electrode system which carries the rf power between each interelectrode spacing, the electrodes being parallel to each other and their planes perpendicular to the axis of the reaction chamber. The substrate material is held independently of the electrode assembly to make loading and unloading of the substrate materials compatible with mass wafer transfer systems, with a reduction in the amount of generated particles.

The invention also provides an improved plasma deposition method, in which the electrodes do not support the substrate material but simply sustain the rf plasma.

The invention further provides an improved arrangement for introducing rf power into a reaction chamber, which is universal in application.

Broadly in an apparatus in accordance with the invention, there is provided a first support means for holding a plurality of electrodes in a spaced parallel array, the support means mounted for rotation about an axis parallel to and external to the peripheries of the electrodes, a second support means for holding a plurality of semiconductor substrates in a spaced parallel array, between the electrodes, the substrates having a predetermined positioned relationship with the electrodes. Means are provided for rotating the support means to move the electrodes out of position, when substrates are readily mounted on the second support means. After mounting of the substrates, the electrodes are rotated back into position.

The invention will be readily understood by the following description of an embodiment, by way of example, in conjunction with the accompanying drawings, in which:

FIG. 7 is a persective view of a reaction gas supply arrangement;

FIG. 8 is a side view of the direction at arrow B in FIG. 7.

Figure 1:
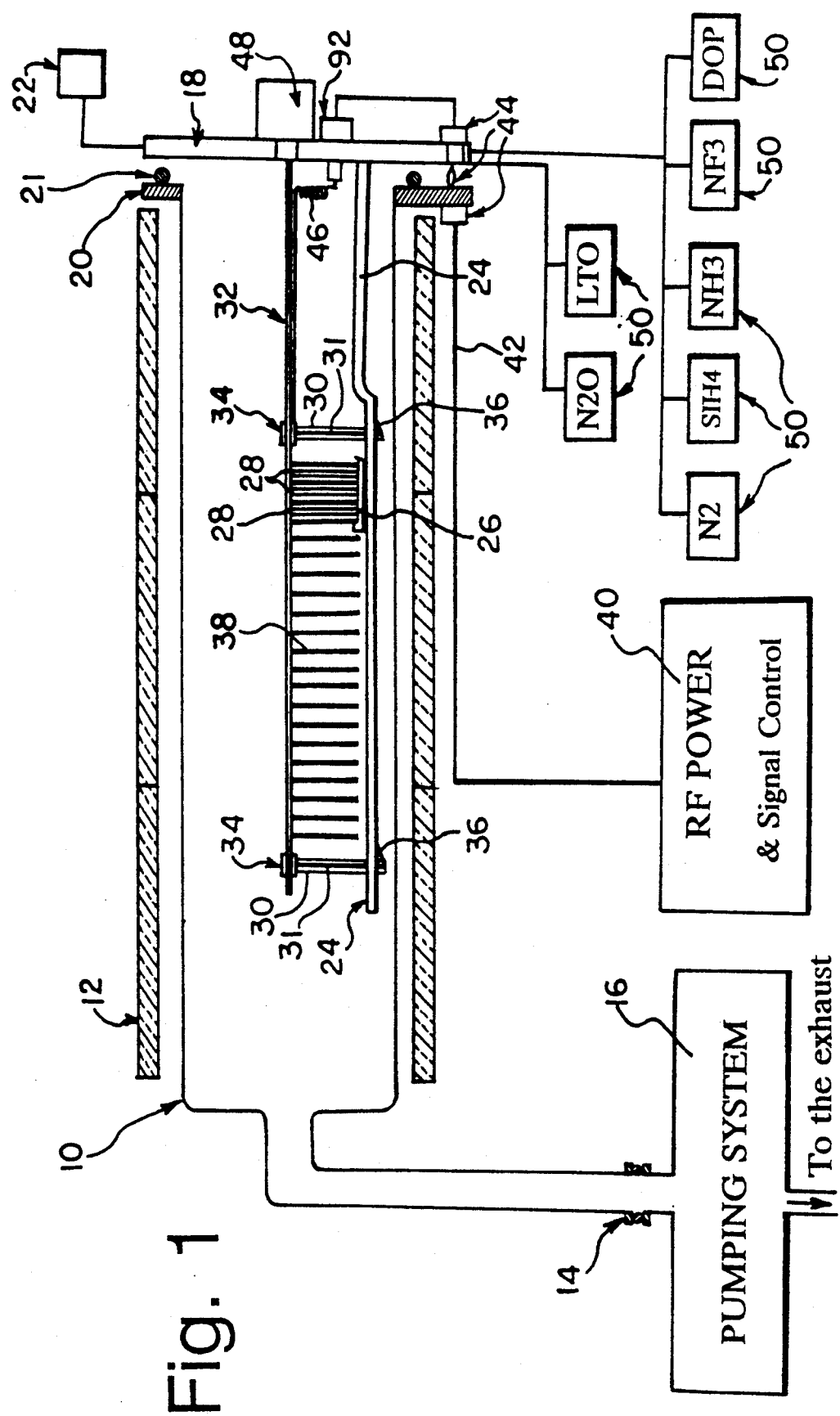
FIG. 1 is a diagrammatic illustration of an apparatus embodying the invention.
Figure 2:
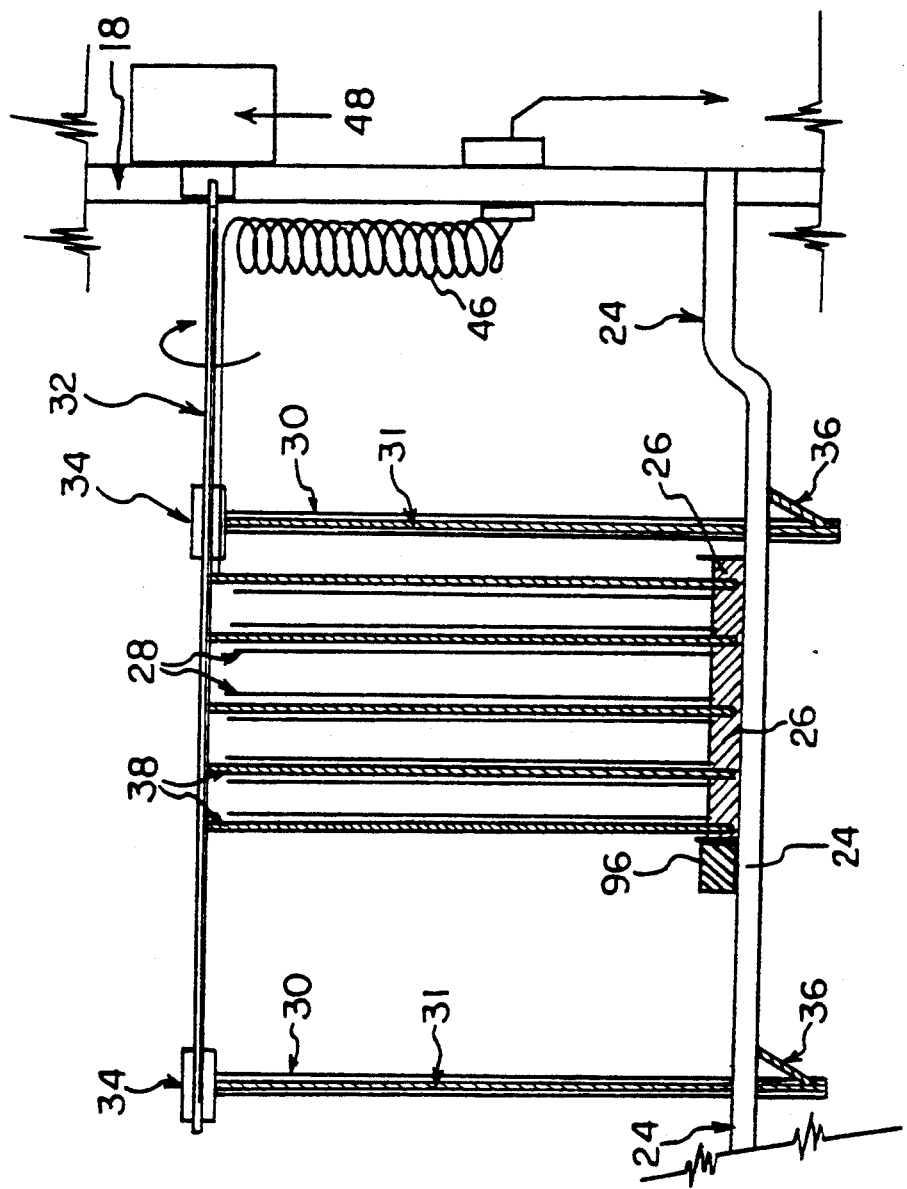
FIG. 2 is a diagrammatic side view of part of the apparatus as in FIG. 1, in more detail.

Illustrated in FIGS. 1 and 2 is a chemical vapour deposition reaction apparatus, generally of conventional form but including the present invention. A reaction chamber or tube 10, which can be evacuated, is surrounded by a multi segment resistance heating element 12. The chamber 10 is of quartz or other suitable material. At one end the chamber is connected, via a flange connection 14, to a pumping system 16. At the other end the chamber is closed by a door 18 which seats against a flange 20 and an O ring 21. The pressure in the chamber is monitored, and controlled, by a pressure controller 22.

A cantilevered support 24 extends from the door 18, and boats 26 (only one of which is shown in FIG. 1) are positioned on the support 24, extending continuously along the support. The boats are for example of quartz and the support 24 of silicon carbide. Each boat carries a plurality of semiconductor substrates on wafers 28. The substrates are spaced apart and parallel and extend laterally, normal to the longitudinal axis of the chamber 10.

Supported by the support 24 via tubes 30 is a shaft 32, the shaft rotating in bushes 34, at the top ends of the tubes 30. The tubes 30 fit over stainless steel rods 31 attached at their lower ends to the support 24, for example by adjustable brackets 36. Electrodes 38 are supported from the shaft 32, as will be explained in connection with FIGS. 4 and 5.

Rf power is conducted from the generator 40 via a power feed 42 to a feedthrough 44 on the door. The rf power is connected, via a flexible connector 46 to electrically conducting mounting brackets associated with the shaft 32, the brackets carrying the electrodes 36.

The shaft 32 is connected to a rotary drive mechanism 48, which can be manually operated or motorized.

Various gas or liquid sources are indicated at 50, for the supply of gases and/or liquids to the reaction chamber, as desired. A particular feed arrangement for the gases or liquids is illustrated in FIGS. 7 and 8.

Figure 3:
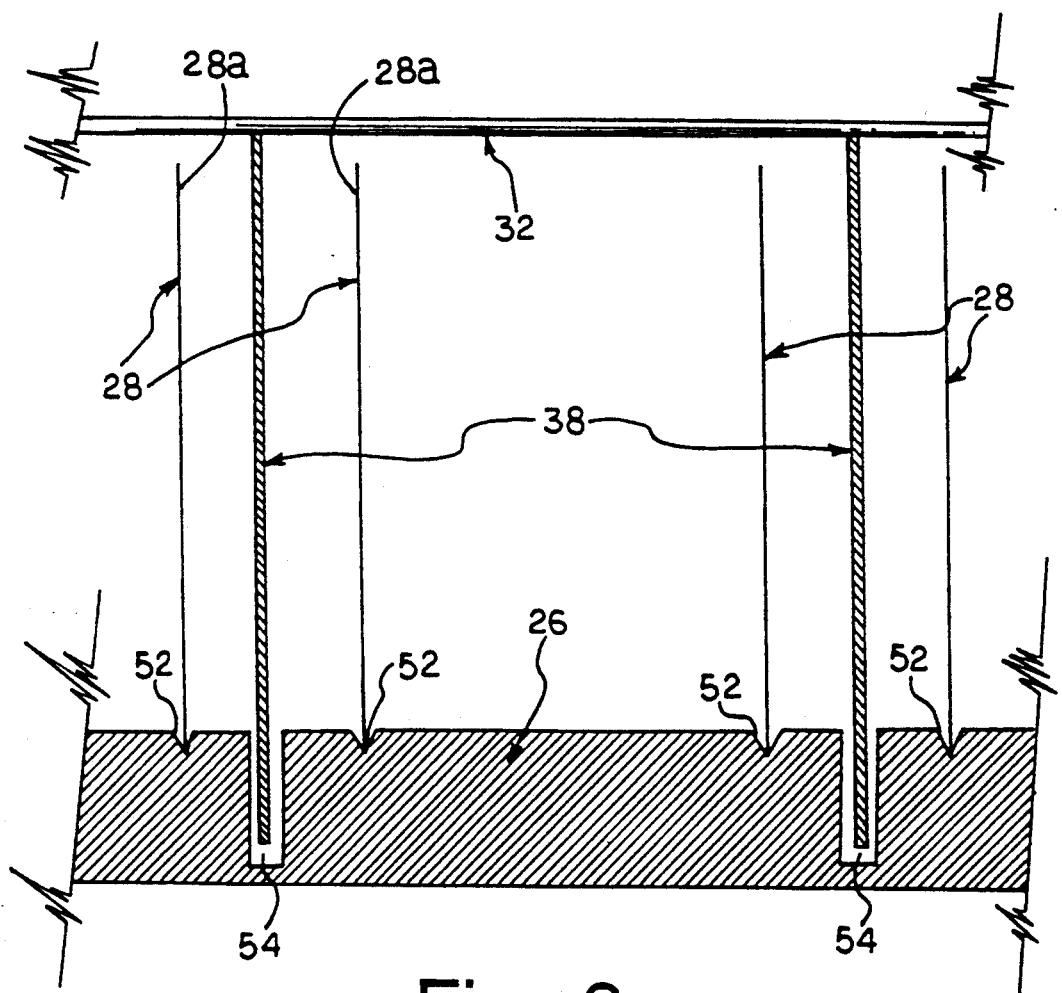
FIG. 3 is a diagrammatic side view of two electrodes and facer substrates illustrating relative positioning.

In FIG. 2 the particular arrangement at the electrodes 38 and the substrates 28 on a boat 26 is seen more clearly. FIG. 3 shows in more detail part of a boat 26 with substrates 28 supported therein, in slots 52. The boat is arcuate in cross section and seen in more detail in FIG. 4. The electrodes 38 extend between substrates and extend into clearance slots 54 in the boat. Each substrate, or wafer 28 has its backsurface 28a facing an electrode. As an example the distance between the back surface of a wafer and the electrode is about 2 mm. Each pair of adjacent electrodes sustains a glow discharge between the front faces of an opposed pair of wafers, the wafers being treated only on their front surfaces. The short gap between the backside of each wafer and the adjacent electrode is small enough to inhibit any glow discharge.

Figure 4:
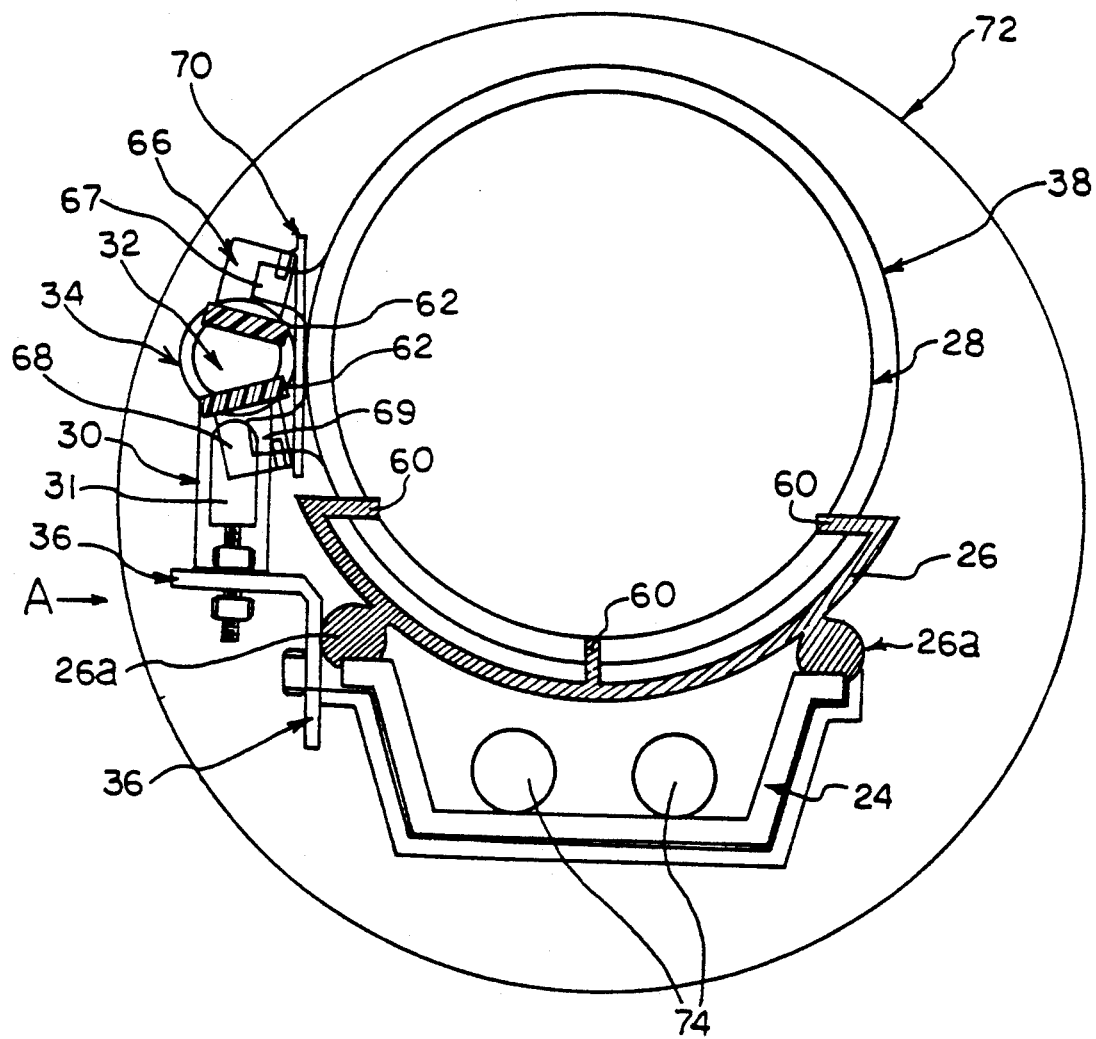
FIG. 4 is a cross-section normal to the longitudinal axis of one form of apparatus embodying the invention, on the line 4—4 of FIG. 5.
Figure 5:
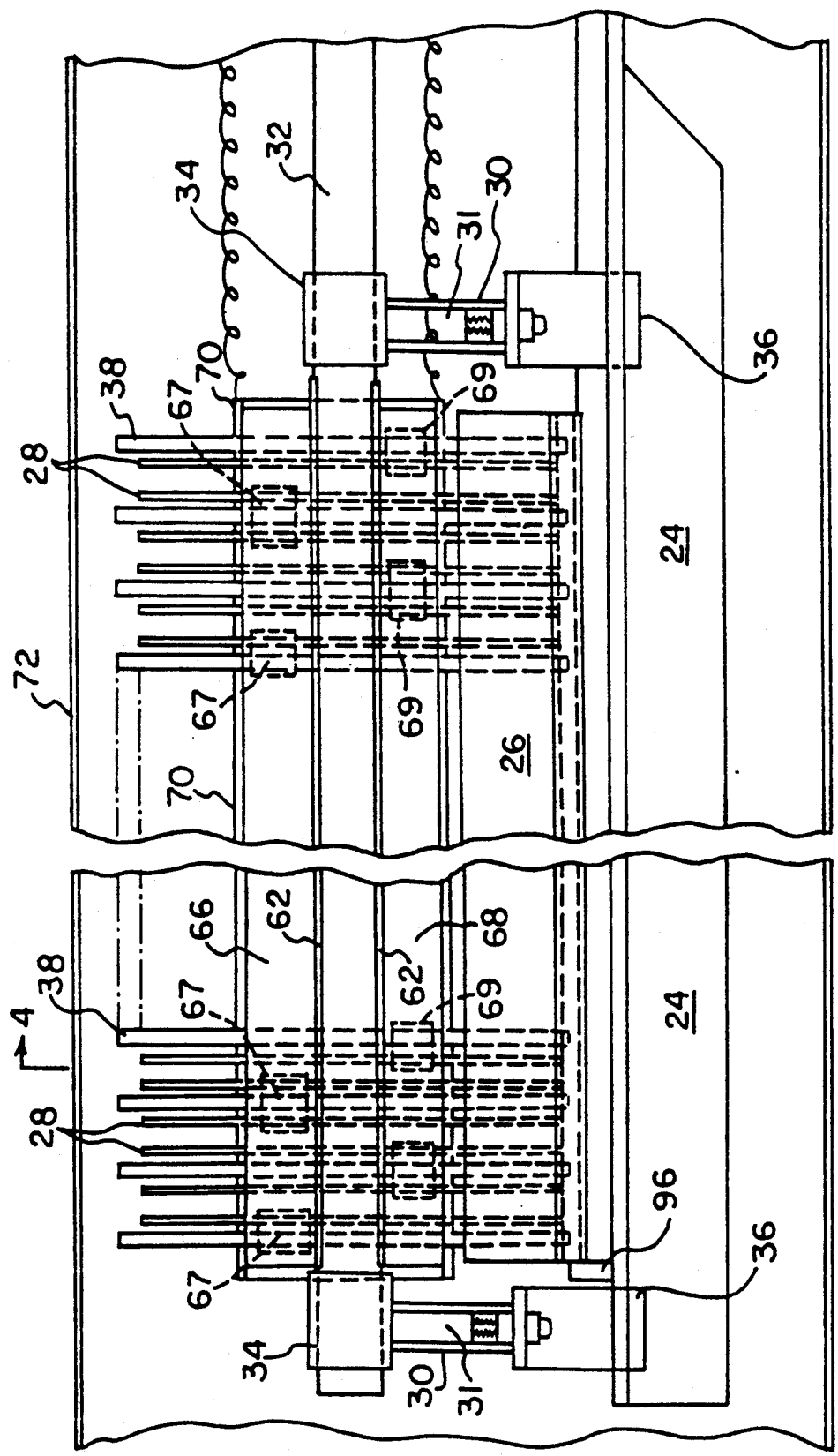
FIG. 5 is a side view of the apparatus illustrated in FIG. 4, in the direction of arrow A in FIG. 4.

As seen in more detail in FIGS. 4 and 5, the boats 26 slide on the support 24, via members 26a which engage with edges of the support to both support and guide the boats. The boats are arcuate in cross-section, in the example having three longitudinally extending ribs 60, one along each top side edge and open at the bottom center of a boat. The ribs each have the slots 52 and slots 54, as shown in FIG. 3.

Tubes 30 and bushes 34 are seen in FIGS. 4 and 5 as is also shaft 32. Mounted on the shaft 32, via insulating members 62, are elongate electrode mounting brackets 66. The electrodes plug in to the brackets 66, 68 in an alternating manner as by radially extending members 67 and 69, the brackets 66 being electrically connected and brackets 68 electrically connected, brackets 68 being of appropriate polarity to brackets 66. Screws can be provided for additionally fastening the electrodes to the brackets. The brackets are of the same form and only one form of electrode is necessary. A securing plate 70 secures the shaft and mounting brackets from the glow discharge, the radially extending members 67 and 69 passing through apertures in the plate.

In FIGS. 4 and 5 the apparatus is shown in a reaction chamber or tube 72. Also seen are gas supply manifolds 74, which can be as described in U.S. Pat. No. 4,672,915.

In an example, the length of the mounting brackets is 700 mm but can be longer or shorter. In this example twenty-eight electrodes would be used. The power is fed to the brackets by the connection 46, in FIG. 1.

Figure 6:
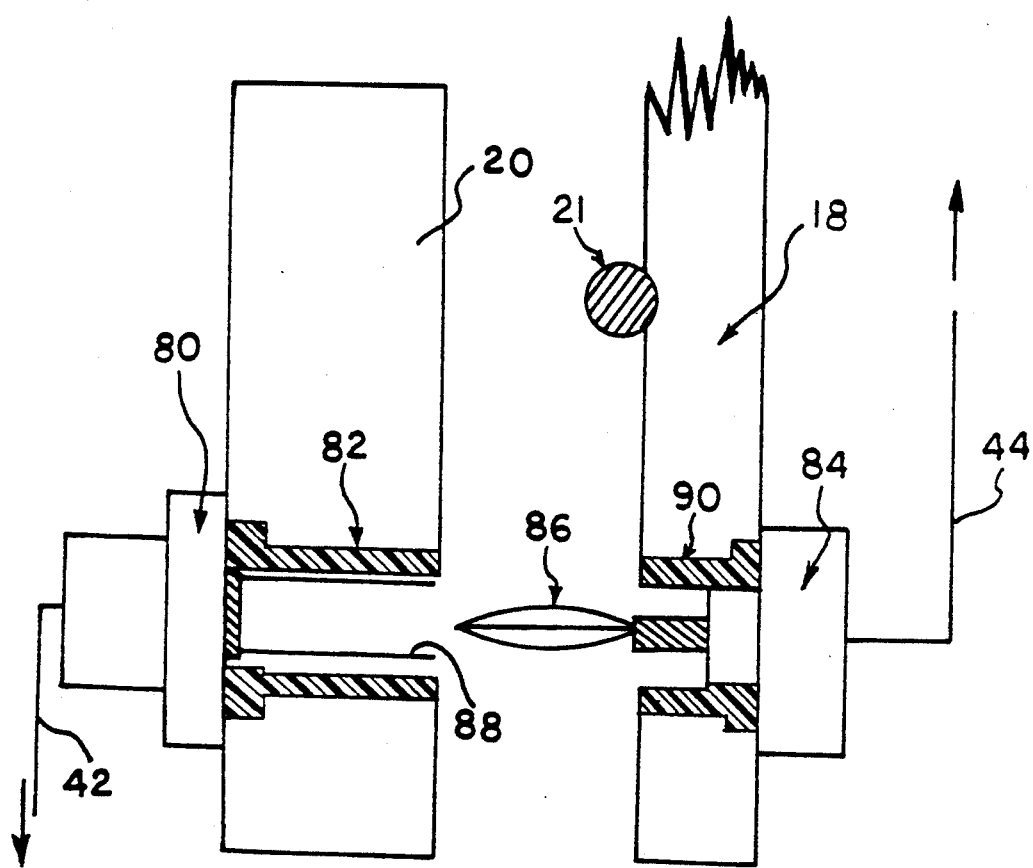
FIG. 6 is a diagrammatic illustration of a power feed arrangement.

FIG. 6 illustrates, in greater detail, the power feed through 44 of FIG. 1. A female coaxial connector 80 is mounted on an extended part of the flange 20 and connected to the rf power supply by the coaxial cable 42. The rf power supply can be one or more of the following conventional forms—high and/or low frequency signals (for example, 13.56 MHz and 50 KHz respectively) with or without external triggering. An insulator 82, for example of PTFE, electrically isolates the flange 20 from the connector 80. A male coaxial connector 84 is fixed on the outside of the door 18. The coaxial connector 84 has a banana plug 86 which plugs into the cylindrical part 88 of the female connector 80 when the door is closed against the flange. The coaxial connector 84 is insulated from the door 18 by an insulator 90.

The connectors 80, 84 are outside the O ring 21 area and are thus outside the vacuum chamber. The male connector 84 is connected to the feed through the door, at 92 in FIG. 1. There will be two such power feed throughs, one for each polarity, and also two feeds 92 through the door. The power feed through as described above and illustrated in FIG. 6 avoids previous disadvantages. In existing arrangements male and female connections are inside the chamber, leading to particle generation. Also the complexity of connectors disposed inside a vacuum requires a difficult and frequent alignment of connectors. Human intervention can be required to disconnect the rf connectors before opening the door of the chamber.

FIGS. 7 and 8 illustrate one arrangement for feeding reaction gases, and liquids, to the chamber. Common reference numerals are used where applicable. In the arrangement illustrated the shaft 32, and the drive mechanism 48 are not shown, for clarity, although an aperture 100 is shown in the door, through which a shaft can extend.

The supply pipes from the gas or liquid sources 50 (FIG. 1) connect to inlet connections 102 on the flange 20. The connections 102 feed to radial holes in the flange which in turn connect with holes 104 (only one of which is seen in FIG. 7) extending to the joint face 106 of the flange.

On the outer surface of the door 18, are transfer tubes 108—in the example two tubes. The tubes 108 are welded to the door, with holes extending through the door. On the inside, on the joint face 110, the lower end of each tube connects to a nipple 112 surrounded by an O ring 114. The upper end of each tube connects to a connector 116 which connects to a flexible tube 118. Each flexible tube connects to a manifold 74.

When the door is closed on to the flange 20, connection is made between the nipples 112 and the holes 104. Thus permanent connections are made between the gas or liquid sources 50 and the chamber 72, at the flange 20, which connections remain made when the door is removed.

The support 24 extends through the door, in the form of a rod-like member 120 which fits into a cylindrical member 122. A flexible section 124 provides for some positional flexibility of the door 18 relative to the support 24.

The apparatus is operated as follows. With the door 18 removed from the end of the chamber and the support 24 withdrawn from the chamber, the shaft 32 is rotated to move the electrodes 38 out from between the substrates 28.

Either boats already loaded with substrates can be positioned on the support 24, replacing any existing boats with treated wafers, or automated substrate loading and unloading apparatus can be used to remove any processed substrates and then reload with unprocessed substrates. The boats are positioned on the support 24 by locating members 96—See FIG. 2—which give the correct positional relationship between electrodes and substrates. The shaft is then rotated to move back the electrodes, into an interleaved relationship with the substrates. The support 24 is then positioned in the chamber and the door sealed. The chamber is then evacuated. The heating may be turned on at this time, or be maintained on even while unloading and loading. The rf power is disconnected when the door is closed. The flow of reactants is commenced when temperature and pressure are at desired values.

The ability to move the electrodes out of position in a simple and easy manner enables rapid and easy unloading and loading of substrates and reduces generation of particles, by the use of mass wafer transfer systems.

What is claimed is:

1. Apparatus for plasma enhanced chemical vapour processing of semiconductor substrates, comprising;
   an elongate first support means for supporting a plurality of semiconductor substrates in a spaced parallel array, the substrates extending laterally relative to a longitudinal axis of said support means;
   second support means mounted on said first support means and comprising a shaft extending parallel to and spaced laterally from said longitudinal axis and spaced electrode holding members positioned along said shaft for holding a plurality of electrodes in a spaced parallel array, said shaft mounted for rotation about an axis extending parallel to and external of the peripheries of said electrodes;
   means for rotating said shaft to move electrodes into and out of interleaving relationship with said substrates;
   means for supplying rf power to said electrodes.

2. Apparatus as claimed in claim 1, said electrode holding members comprising first and second holding members mounted on said shaft, and attachment means on said holding members for attachment of said electrodes alternately to said first and second holding members, said first and second holding members being of opposite polarities.

3. Apparatus as claimed in claim 1, said first support means including means for guiding and supporting at least one boat for holding said substrates.

4. Apparatus as claimed in claim 3, said boat including a first series of slots for holding said substrates in said spaced parallel array and including a second series of clearance slots for reception of said electrodes.

5. Apparatus as claimed in claim 1, including an elongate reaction chamber and including a door at one end for closing said chamber, said elongate first support means mounted on an inner surface of said door to extend longitudinally in said chamber.

6. Apparatus as claimed in claim 5, said means for rotating said shaft extending through said door and including a drive mechanism, said mechanism being one of power and manually operated.

7. Apparatus as claimed in claim 5, said means for supplying rf power including a power feed through in said door for disconnection when said door is opened and reconnection when said door is closed.

8. Apparatus as claimed in claim 7, including a flange at said one end of said chamber, said power feed through comprising two connections, each connection comprising a first connector extending through said flange from an outer surface to a joint surface; a second connector extending through said door from an outer surface to a joint surface; one of said connectors of female form and the other connector of male form; a projecting connection member on the male connector mating with a hollow member of the female connector when said joint faces are brought into close cooperating closing position.

9. Apparatus as claimed in claim 8, including at least one sealing member extending peripherally between said door and said flange to seal said chamber, each of said first and second connectors being positioned externally of said sealing member.

10. Apparatus as claimed in claim 9, including means for connecting said first connectors to an rf power source and means for connecting said second connectors to power connecting means in said door, and conductor means for connecting said power connecting means to said electrode holding members.

11. Apparatus as claimed in claim 5, including means at said one end of said chamber for feeding reaction fluids to said chamber.

12. Apparatus as claimed in claim 11, including means at the other end of said chamber for producing a sub atmospheric pressure in said chamber.

13. Apparatus as claimed in claim 4, said first series of slots spaced to position two substrates between each adjacent pair of electrodes.

14. Apparatus as claimed in claim 13, each substrate positioned to have a back surface at a distance from an electrode below that for forming a glow discharge between said back surface and said electrode.

15. Apparatus as claimed in claim 11, including a flange at said one end of said chamber, said means for feeding reaction fluids to said chamber comprising a connection on an outside of said flange for each fluid supply, each connection extending through said flange to an aperture in a joint face of said flange; a transfer tube for each fluid supply on an outer surface of said door, one end of each tube connected through said door to connecting means positioned to cooperate each with one of said apertures in said joint face of said flange, the other end of each tube connected through said door to connecting means on said joint face of said door and a flexible connection between each said connecting means on said joint face of said door to a supply manifold.

16. A method for the plasma enhanced vapour processing of semiconductor substrates, comprising:
   positioning a series of substrates in a spaced parallel array on an elongate support, the substrates extending transversely relative to a longitudinal axis of said support;
   mounting a shaft on said support, said shaft mounting a series of electrodes in a spaced parallel array on said shaft;
   rotating said shaft about its axis to move said electrodes into interleaving relationship with said substrates;
   inserting said support, substrates and electrodes into a reaction chamber;
   producing a plasma in said chamber and processing said substrates;
   removing said support, substrates and electrodes from said reaction chamber;
   rotating said shaft to move said electrodes out of interlocking relationship with said substrates, for unloading substrates.

* * * * *